(12) United States Patent
Cai et al.

(10) Patent No.: US 9,583,597 B2
(45) Date of Patent: Feb. 28, 2017

(54) ASYMMETRIC FINFET SEMICONDUCTOR DEVICES AND METHODS FOR FABRICATING THE SAME

(71) Applicants: GLOBALFOUNDRIES, Inc., Grand Cayman (KY); International Business Machines Corporation, Armonk, NY (US)

(72) Inventors: Xiuyu Cai, Niskayuna, NY (US); Ruilong Xie, Niskayuna, NY (US); Kangguo Cheng, Albany, NY (US); Ali Khakifirooz, Mountain View, CA (US)

(73) Assignees: GLOBALFOUNDRIES, INC., Grand Cayman (KY); INTERNATIONAL BUSINESS MACHINES CORPORATION, Armonk, NY (US)

( * ) Notice: Subject to any disclaimer, the term of this patent is extended or adjusted under 35 U.S.C. 154(b) by 306 days.

(21) Appl. No.: 13/902,540

(22) Filed: May 24, 2013

(65) Prior Publication Data

US 2014/0346574 A1 Nov. 27, 2014

(51) Int. Cl.
*H01L 27/088* (2006.01)
*H01L 29/66* (2006.01)
*H01L 29/78* (2006.01)

(52) U.S. Cl.
CPC .... *H01L 29/66795* (2013.01); *H01L 27/0886* (2013.01); *H01L 29/785* (2013.01); *H01L 29/7855* (2013.01)

(58) Field of Classification Search
CPC ............ H01L 27/0886; H01L 27/0924; H01L 27/10879; H01L 27/1211; H01L 29/41791; H01L 29/66795; H01L 29/7831
See application file for complete search history.

(56) References Cited

U.S. PATENT DOCUMENTS

| | | | |
|---|---|---|---|
| 6,413,802 B1 * | 7/2002 | Hu et al. | ........................ 438/151 |
| 8,822,320 B2 * | 9/2014 | Cheng | ................. H01L 21/3086 257/288 |
| 8,941,189 B2 * | 1/2015 | Chowdhury | .... H01L 21/823821 257/401 |
| 2004/0169239 A1 * | 9/2004 | Rim | .............................. 257/411 |
| 2005/0001273 A1 * | 1/2005 | Bryant | ................ H01L 21/3086 257/369 |
| 2006/0261414 A1 * | 11/2006 | Hovis | ............... H01L 29/42384 257/366 |
| 2006/0292772 A1 * | 12/2006 | Anderson et al. | ............. 438/197 |
| 2008/0149984 A1 * | 6/2008 | Chang | .................. H01L 27/108 257/314 |

(Continued)

Primary Examiner — Benjamin Sandvik
(74) Attorney, Agent, or Firm — Lorenz & Kopf, LLP (57) ABSTRACT

Asymmetric FinFET devices and methods for fabricating such devices are provided. In one embodiment, a method includes providing a semiconductor substrate comprising a plurality of fin structures formed thereon and depositing a conformal liner over the fin structures. A first portion of the conformal liner is removed, leaving a first space between the fins structures and forming a first metal gate in the first space between the fin structures. A second portion of the conformal liner is removed, leaving a second space between the fin structures and forming a second metal gate in the second space between the fin structures.

6 Claims, 10 Drawing Sheets

(56) References Cited

U.S. PATENT DOCUMENTS

| | | | |
|---|---|---|---|
| 2011/0079852 A1* | 4/2011 | Lander | H01L 29/66795 257/347 |
| 2013/0113042 A1* | 5/2013 | Wang | H01L 21/82343 257/347 |
| 2013/0319613 A1* | 12/2013 | Basker | H01L 29/66795 156/345.24 |
| 2014/0131813 A1* | 5/2014 | Liaw | H01L 27/1104 257/401 |

* cited by examiner

ASYMMETRIC FINFET SEMICONDUCTOR DEVICES AND METHODS FOR FABRICATING THE SAME

TECHNICAL FIELD

The technical field generally relates to semiconductor devices and methods for fabricating semiconductor devices, and more particularly relates to asymmetric, multi-gated FinFET semiconductor devices and methods for fabricating the same.

BACKGROUND

In contrast to traditional planar metal-oxide-semiconductor field-effect transistors (MOSFETs), which are fabricated using conventional lithographic fabrication methods, non-planar FETs incorporate various vertical transistor structures, and typically include two or more gate structures formed in parallel. One such semiconductor structure is the "FinFET," which takes its name from the multiple thin silicon "fins" that are used to form the respective gate channels of the transistors, and which are typically on the order of tens of nanometers in width.

In these fin type devices, the transistor is formed in part in a fin rising out of a planar background, typically having both vertical and horizontal surfaces. The gate of the non-planar device may engage the vertically oriented body surfaces, or sidewalls, of the fin, and the top surface as well, resulting in several planes being used for transistor channel formation. In other typical non-planar devices the gate of the non-planar device may not engage the top surface, only the vertically oriented body surfaces. There are further variations of non-planar devices, for instance, some with multi-faceted fins and multiple sidewall sections.

A typical FinFET, as fabricated and used presently in the art, has a symmetric structure, meaning that the FET devices on each side surface of the fin are essentially identical with one other, having same device characteristics. However, for some applications, it is desirable to have an asymmetric, multi-gated FinFET. For instance, depending on the power supply, the characteristics of the asymmetric FinFET can be adjusted to achieve an optimal trade-off between power consumption and device performance. For example, when the FinFET is powered by a battery, low power consumption requirements usually outweigh performance requirements. On the other hand, when the FinFET is powered by an external AC supply, high performance is usually desired. In FinFETs where the gate structure is asymmetric, one gate is typically referred to as the "front gate" (FG) and the other gate is typically referred to as the "back gate" (BG).

Fabricating asymmetric, multi-gated FinFETs may be possible with complicated and costly methods. Such complicated and costly methods typically require additional masking steps compared to fabricating symmetric, namely essentially identical, FET devices on semiconductor fins. Furthermore, the small-scaled fins that are presently used in the art and that are planned in the future are narrow, rendering overlaying masks very difficult.

It would therefore be desirable to have asymmetric FinFET devices with improved methods for forming them, which methods would be similar in complexity and in cost to fabricating traditional, symmetric FinFET devices. Furthermore, other desirable features and characteristics of the present invention will become apparent from the subsequent detailed description of the invention and the appended claims, taken in conjunction with the accompanying drawings and this background of the invention.

BRIEF SUMMARY

Asymmetric FinFET devices and methods for fabricating such devices are provided. In accordance with an exemplary embodiment, a method includes providing a semiconductor substrate including a plurality of fin structures formed thereon and depositing a conformal liner over the fin structures. A first portion of the conformal liner is removed, leaving a first space between the fins structures and forming a first metal gate in the first space between the fin structures. A second portion of the conformal liner is removed, leaving a second space between the fin structures and forming a second metal gate in the second space between the fin structures.

In accordance with another exemplary embodiment, a method includes providing a semiconductor substrate, forming a plurality of mandrels overlying the semiconductor substrate, wherein each of the plurality of mandrels has sidewalls, forming spacers about the sidewalls of the plurality of mandrels, removing the mandrels from over the semiconductor substrate, and etching the semiconductor substrate to form fin structures, each fin structure having a width substantially equal to the spacer width. The method further includes depositing a conformal liner over the fin structures, removing a first portion of the conformal liner, leaving a first space between the fins structures, and forming a first metal gate in the first space between the fin structures. Still further, the method includes removing a second portion of the conformal liner, leaving a second space between the fin structures and forming a second metal gate in the second space between the fin structures.

In yet another exemplary embodiment, a semiconductor structure includes a semiconductor substrate and a first, second, and third fin structures disposed over the semiconductor substrate. The first fin structure is spaced apart from the second fin structure by a first gap region having a first width across the semiconductor substrate, and the second fin structure is space apart from the third fin structure by a second gap region having a second width across the semiconductor substrate that is greater than the first width. The semiconductor structure further includes a first metal gate including a first metal gate material disposed within the first gap region and a second metal gate including a second metal gate material disposed within the second gap region.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description.

FinFET semiconductor devices have recently gained interest for use in small-scale integrated circuits, such as those that are scaled at 22 nanometers (nm) and smaller.

Asymmetric FinFET semiconductor devices are particularly useful in some applications where the front gate (FG) and the back gate (BG) serve different purposes in a device in which they are employed. An exemplary application of asymmetric FinFET devices is the floating body memory integrated circuit in which the FG is used for programming and sensing while the BG serves to improve programming and memory retention. Forming asymmetric FinFET semiconductor devices in accordance with techniques known in the prior art requires numerous masking procedures in conjunction with complex patterning, which is increasingly difficult to make compatible with small-scale technologies, such as those that are scaled at 22 nm and smaller. Thus, embodiments described herein provide asymmetric, multi-gated semiconductor devices and methods for fabricating the same that require fewer masking and patterning procedures, for an overall lower design and fabrication cost.

In one exemplary embodiment, as illustrated in FIGS. 1-4, a method for fabricating a FinFET semiconductor device includes providing a semiconductor substrate that includes a plurality of fin structures formed thereon. As used herein, the term "semiconductor substrate" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. The semiconductor material is preferably a silicon substrate. The silicon substrate may be a bulk silicon wafer or, as illustrated, may include a silicon-containing material 103 disposed on a silicon oxide material 102 (or "buried oxide" (BOX) layer), commonly known as a silicon-on-insulator (SOI) structure that, in turn, is supported by a support substrate 101.

An insulating oxide layer 104 is disposed overlying the silicon-containing material 103. The oxide layer 104 includes any suitable silicon oxide material that exhibits a lower etch rate than the silicon-containing material 103 when subjected to the same etch chemistry. In this regard, adequate control of the fin-forming etch process, discussed in more detail below, can be achieved.

The fins may be formed on the semiconductor substrate as-provided, or alternatively the fins may be formed on the semiconductor substrate in the following manner, or any other manner as known in the art. As shown particularly in FIG. 1, the fin forming process beings with forming a plurality of mandrels overlying the semiconductor substrate. A mandrel-forming material is deposited on the oxide layer 104. Examples of suitable materials for the mandrel-forming material include, but are not limited to, photoresist, polycrystalline silicon, silicon oxide, silicon nitride, and the like. Mandrel-forming material has a thickness in the range of about 15 nm to about 25 nm.

Figure 1:
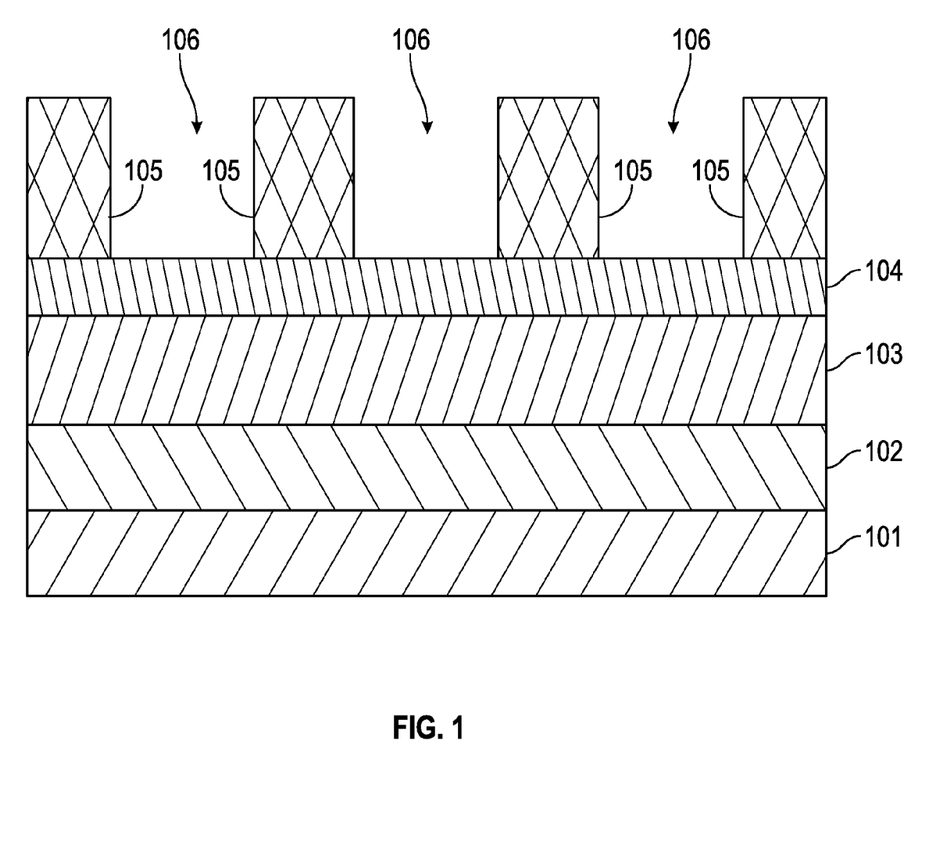
FIGS. 1-10 illustrate, in cross section, FinFET structures and methods for fabricating FinFET structures in accordance with various embodiments contemplated herein.

After deposition of the mandrel-forming material, one or more patterned masks (not shown), such as one or more patterned photoresists, is formed on the mandrel-forming material, which then is etched to form the plurality of mandrels 105 having spaces 106 therebetween. In one embodiment, if the mandrel-forming material layer includes silicon nitride or polycrystalline silicon, the mandrel-forming material layers can be etched by $CF_4$, $CHF_3$, $CH_2F_2$ chemistries and $Cl_2$ or HBr chemistries, respectively.

Figure 2:
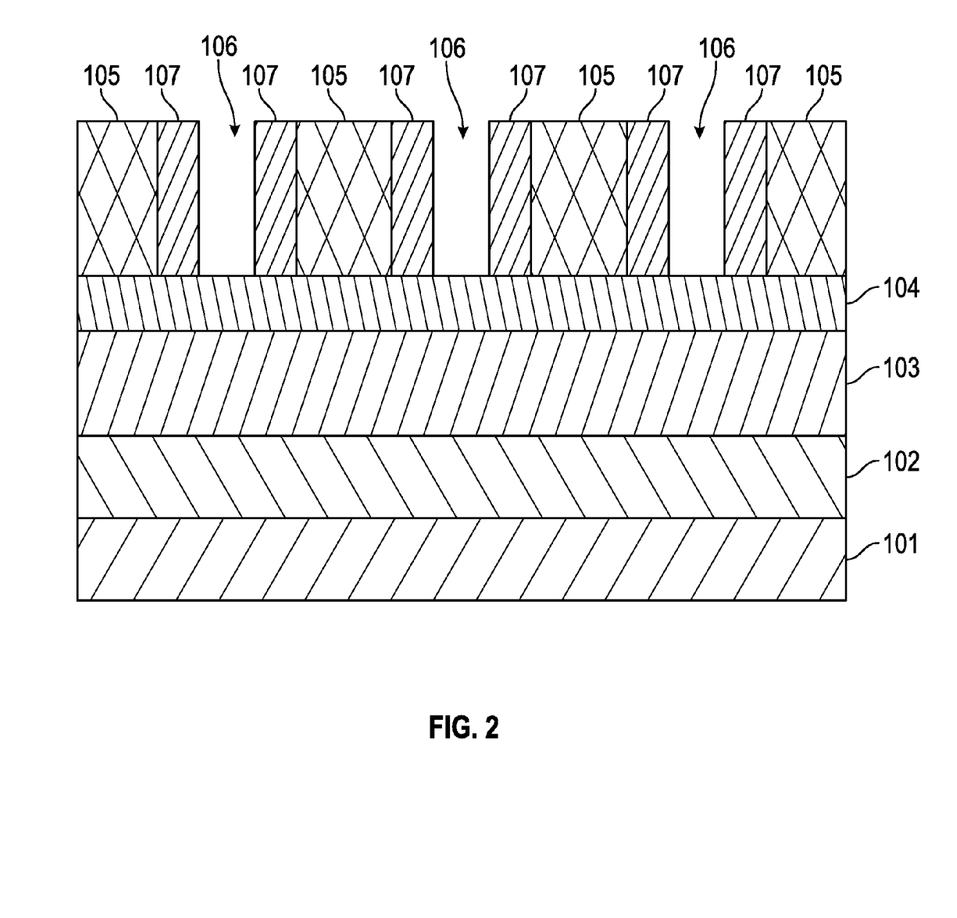

The fin forming process continues at FIG. 2 with the formation of spacers 107 about the sidewalls of the plurality of mandrels. A spacer-forming material (not shown) is conformally deposited overlying the mandrels 105 and within the spaces 106. The spacer-forming material includes a material having an etch rate that is slower than an etch rate of the mandrel-forming material layer when subjected to the same etch chemistry. In one embodiment, the spacer-forming material is deposited to a thickness in the range of about 15 nm to about 25 nm. In an embodiment, if mandrel-forming material includes a silicon nitride or polycrystalline silicon, spacer-forming material includes a silicon oxide or a silicon nitride.

The fin forming process continues with the anisotropic etch of the spacer-forming material to form rectangular spacers 107 disposed adjacent to the sidewalls of mandrels 105. The anisotropic etch may be performed by reactive ion etching using a chemistry, such as, for example, a $CH_4$, $CHF_3$, or $CH_2F_2$ chemistry, that etches the spacer-forming material but that is selective to the silicon oxide layer 104. After etching, the spaces between mandrels 106 are re-formed, but are narrower as compared to those illustrated in FIG. 1.

Figure 3:
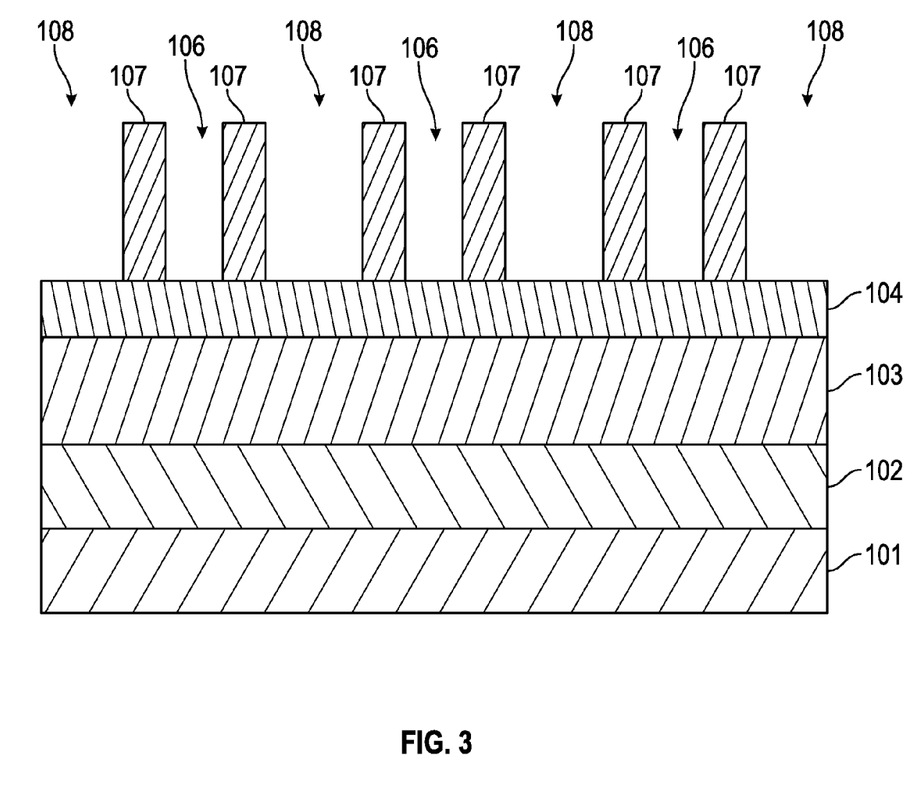

As shown in FIG. 3, the fin forming process continues with the removal of the mandrels 105. A polycrystalline silicon mandrel-forming material can be removed using an ammonium hydroxide etch chemistry or a hot phosphoric acid chemistry. The etchant is selective to the silicon oxide layer 104, which serves as an etch-stop for this process. Thus, after removal of the mandrels 105, remaining above the silicon oxide layer 104 are the sidewall spacers 107, having spaces 106 therebetween as noted above, and now having additional spaces 108 therebetween, formed as a result of the removal of the mandrels 105.

Figure 4:
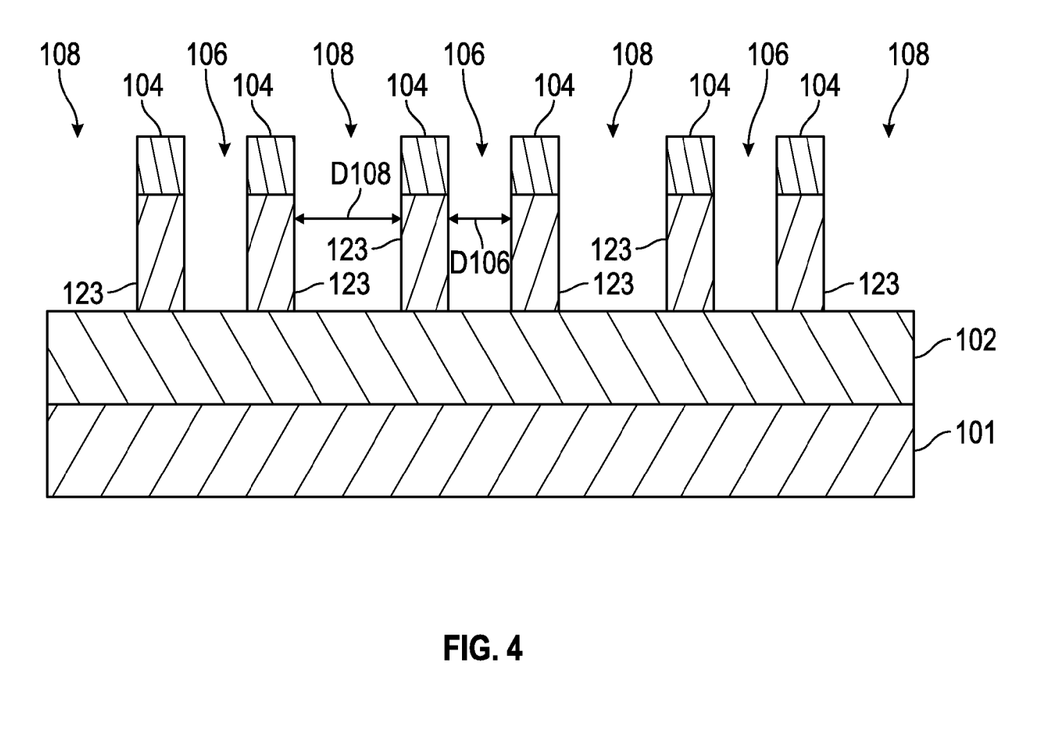

Next, after removal of mandrels 105, the silicon oxide layer 104 and the silicon-containing material layer 103 are etched using the rectangular sidewall spacers 107 as an etch mask to form silicon-containing fins 123, as illustrated in FIG. 4. The rectangular spacer profile results in a symmetric and right angular fin profile, which in turn leads to enhanced device performance. The fins 123 are formed having a width that is substantially equal to the width of the rectangular spacer 107, which have been substantially reduced in height due to the etching process for forming the fins. In one exemplary embodiment, the width of the fins 123 is about 5 nm to about 20 nm. Further, the spaces 106 and 108 have been extended in depth, due to the removal of portions of layers 104 and 103. Thus, due to the difference in width of the spaces 106 and 108, the spacing between fins 123 alternates in a repeating pattern between a space 106 that is relatively more narrow in width, as shown by arrow D106, and a space 108 that is relatively greater in width, as shown by arrow D108. In one embodiment, width D106 is from about 10 nm to about 40 nm, and width D108 is from about 20 nm to about 50 nm. As further shown in FIG. 4, a portion of the oxide layer 104 remains above each fin 103 to serve as a masking layer in subsequent processing steps.

Figure 5:
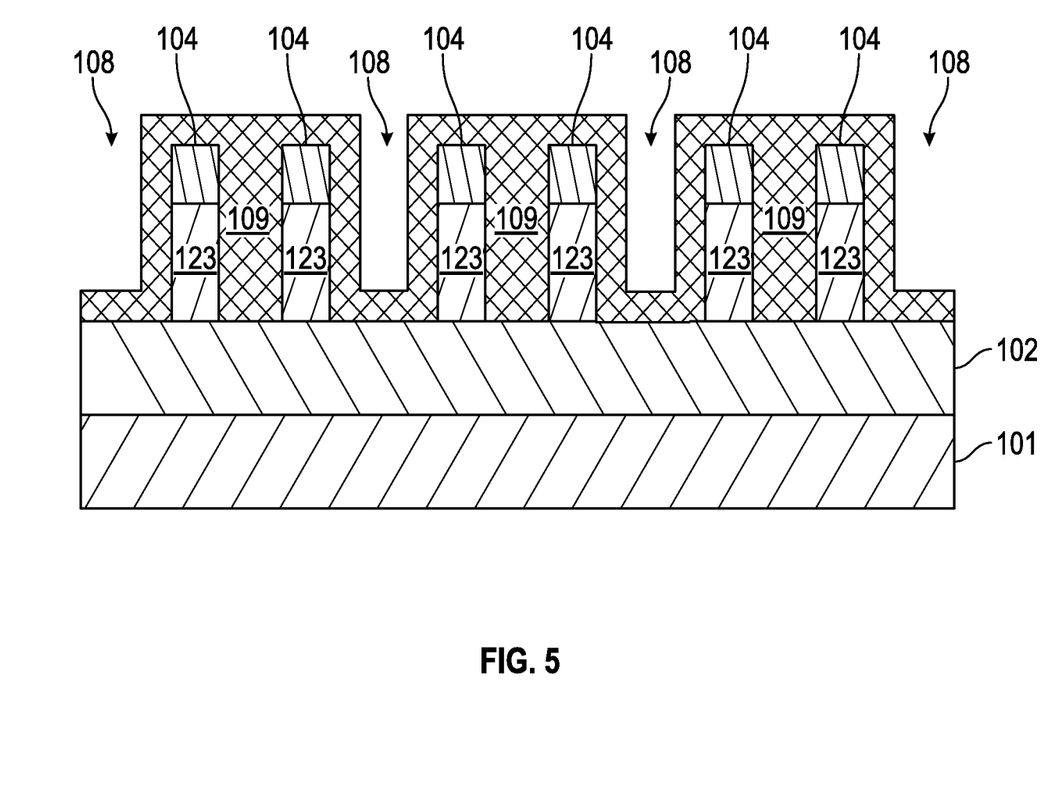

Now that the fins 123 have been formed over the semiconductor substrate, the exemplary method for fabricating the FinFET semiconductor device continues with depositing a conformal liner over the fins 123, as shown in FIG. 5. The conformal liner 109 is deposited to a thickness that is about half the width D106. As such, the liner fully fills the spaces 106 when it is deposited on opposite fins 123. In contrast, the relatively wider spaces 108 are not fully filled by the deposition of the liner 109. Any liner may be deposited as liner 109, for example, silicon nitride, silicon oxide, silicon oxynitride, amorphous silicon, or polycrystalline silicon.

Figure 6:
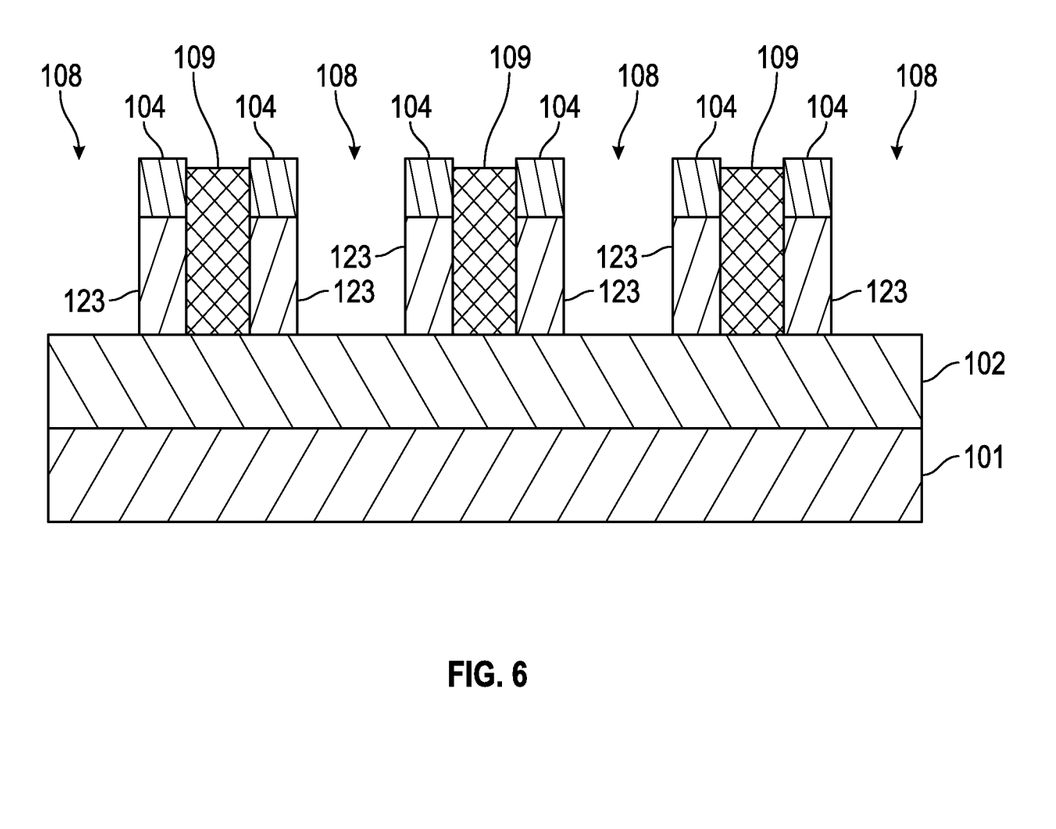

The exemplary method continues with a step of removing a first portion of the conformal liner 109. As shown particularly, in FIG. 6, the liner 109 is removed so as to re-form spaces 108 to their full original width D108 (i.e., the original width of the mandrels 105). This is achieved by isotropically etching back the liner material 109 with a target removal amount close to its initial deposition thickness. In this manner, using the isotropic etch, there is no need to apply and/or pattern any additional masking material to remove the liner material 109 only so as to re-form the spaces 108, while leaving the liner material 109 at least substantially filling the spaces 106. In one embodiment, if the liner material includes silicon nitride or polycrystalline silicon, the liner material layers can be dry etched by $CF_4$, $CHF_3$, $CH_2F_2$ chemistries and $Cl_2$ or HBr chemistries, respectively, or wet etched by hot phosphorous and hot ammonia, respectively.

Figure 7:
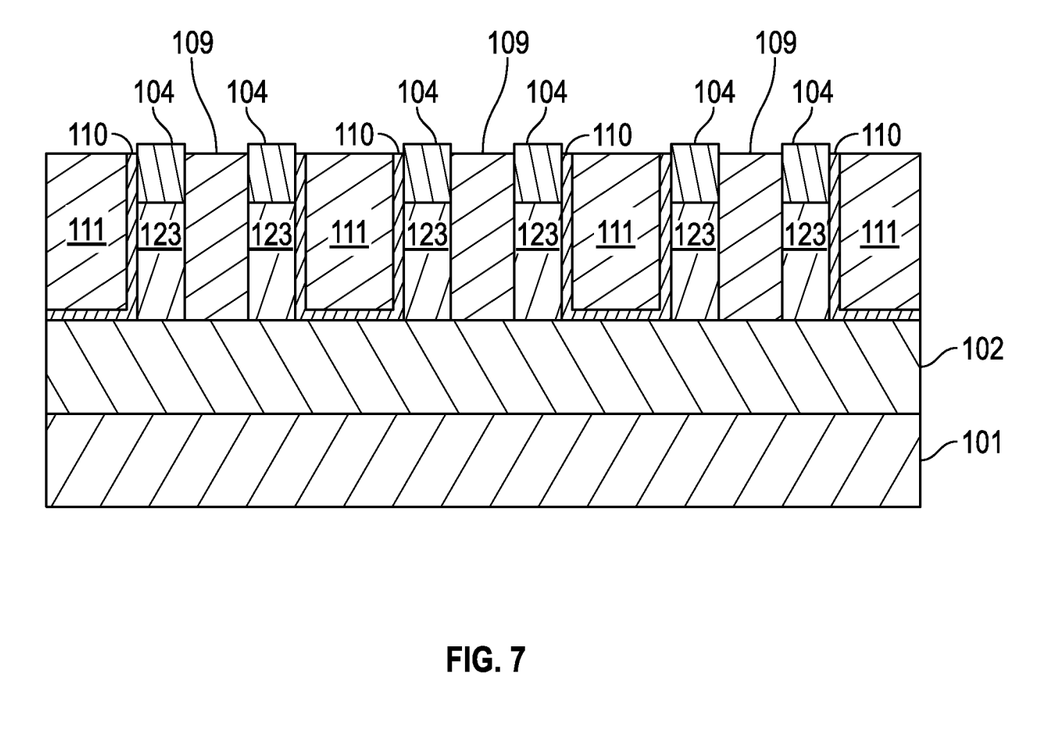

Thereafter, the method for fabricating the FinFET semiconductor device continues, as illustrated in FIG. 7, by forming a first metal gate in the space 108 between the fins 123. In one embodiment, formation of the first metal gate begins with the deposition of a first gate dielectric layer 110 in the spaces 108. The first gate dielectric layer can be $SiO_2$, SiON, or a high-dielectric constant ("high-k") material layer such as a hafnium (Hf) or zirconium (Zr) oxide, or any other metal oxide with a sufficiently high dielectric constant as are well-known in the art. In an exemplary embodiment, the first gate dielectric material 110 is $HfO_2$. The first gate dielectric layer 110 can be deposited by any technique known in the art that provides for conformal deposition thereof in the spaces 108. In one embodiment, 110 is deposited using atomic layer deposition (ALD).

Thereafter, a conductive metal layer 111 and optionally one or more workfunction material layers (not illustrated) are deposited over the high-k layer 110, to form a metal gate 115 followed by a chemical mechanical planarization (CMP) process to remove the excess high-k layer 110 and conductive metal layer 111 (and any workfunction material layers, if provided). The remaining portions of oxide layer 104 above the fins serves as an etch stop for the CMP process. Of course, if provided, any workfunction material layer may include two or more workfunction materials, and can be deposited using a process that provides for conformal deposition, for example ALD. Exemplary work function materials include TiN, TaN, TaC, and TiAlN, and combinations thereof. The conductive metal layer 111 is provided to decrease the line resistance in the gate structure, as is known in the art. Typical conductive metals that may be employed for metal layer 111 include, for example, aluminum, tungsten, or copper, or combinations thereof.

Figure 8:
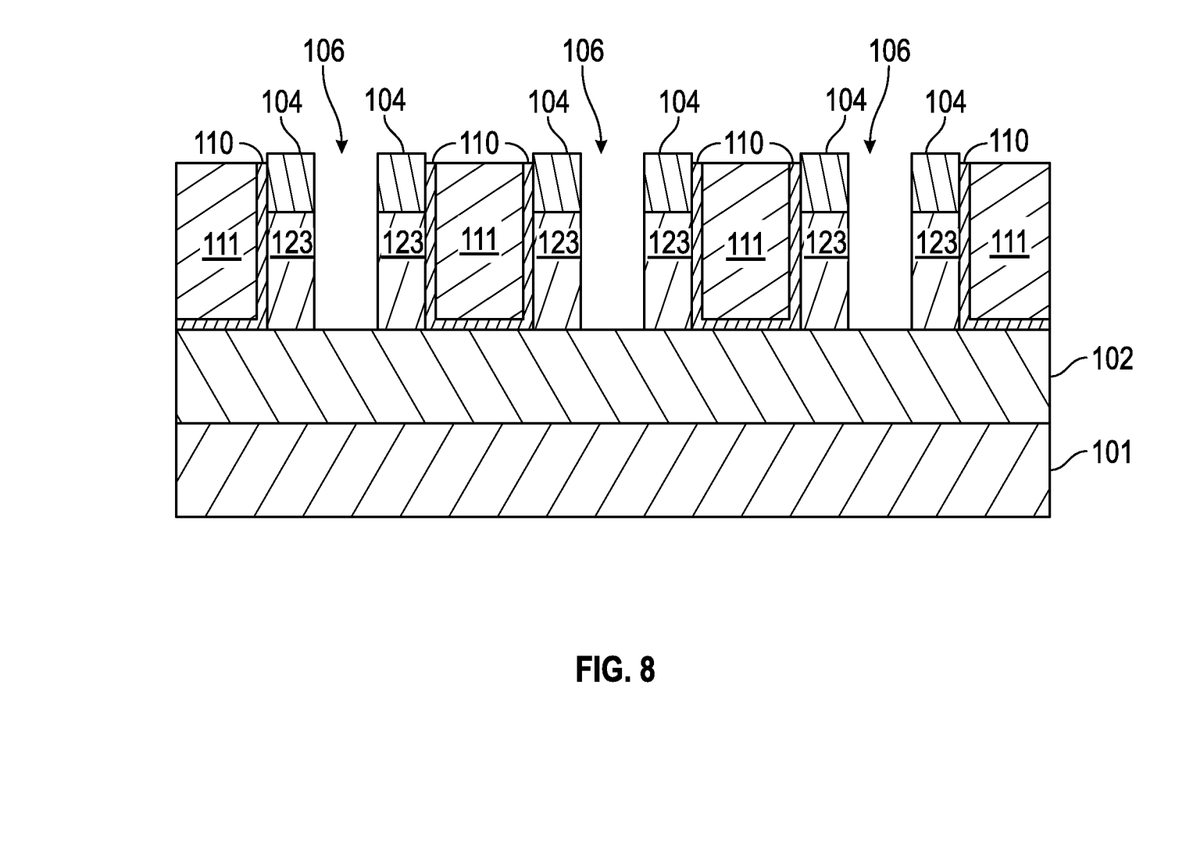

The exemplary method continues by selectively removing a second portion of the conformal liner 109, while not removing the other exposed layers (i.e., 104, 110, and 111). As shown particularly, in FIG. 8, the liner 109 is selectively removed so as to re-form spaces 106 to their full original width D106 (i.e., the original width between the mandrels 105). In one embodiment, if the liner material includes silicon nitride or polycrystalline silicon, the liner material layers can be etched by $CF_4$, $CHF_3$, $CH_2F_2$ chemistries and $Cl_2$ or HBr chemistries, respectively. With appropriate selection of etchant, no additional masking material is required to be deposited and/or patterned to perform this etching step.

Figure 9:
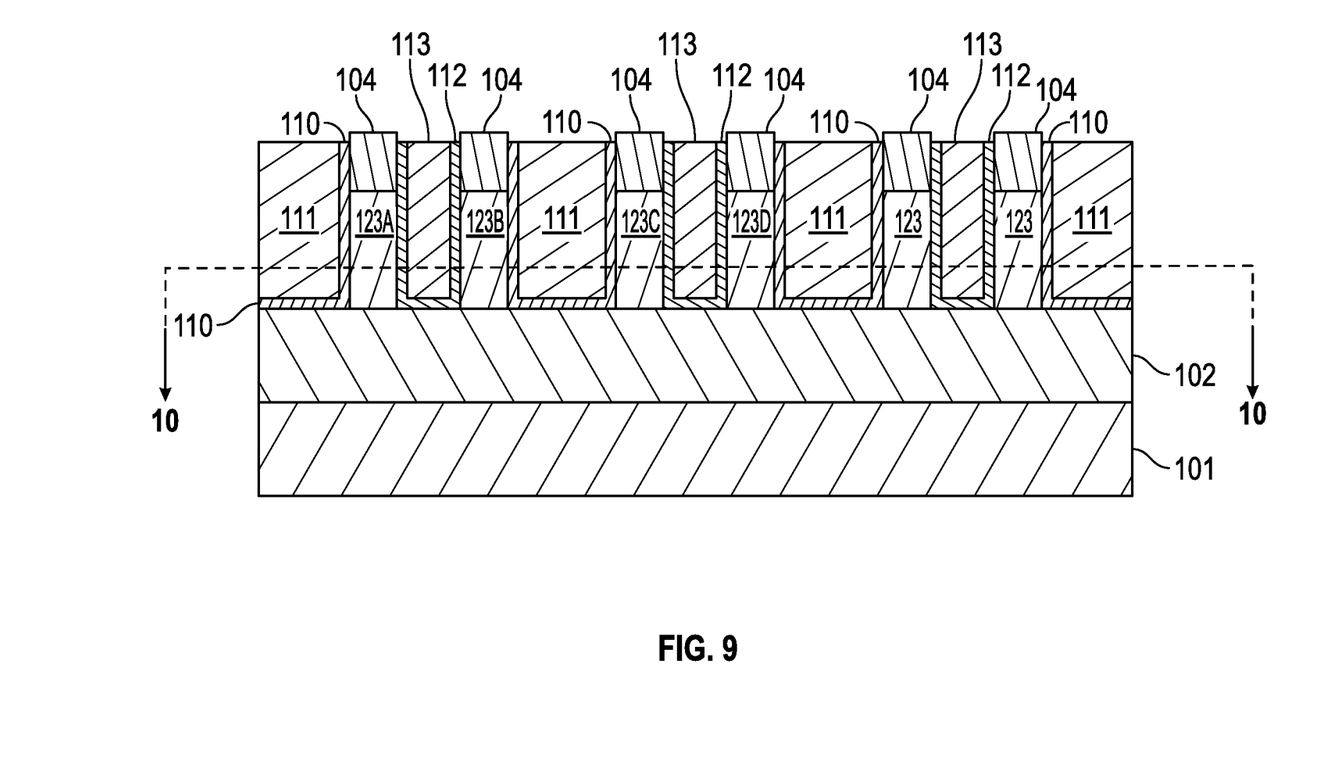

Thereafter, the method for fabricating the FinFET semiconductor device continues, as illustrated in FIG. 9, with the formation of a second metal gate 116 in the spaces 106 between the fin structures. This step is performed substantially the same as described above with regard to FIG. 7, and thus the details are not reiterated herein for brevity. It is noted that the first gate dielectric layer 110 and a second gate dielectric layer 112 may have different chemical compositions and/or different thicknesses to provide an asymmetric FinFET, wherein the first gate 115 exhibits different functional characteristics than the second gate 116 (one of which therefore being termed the "front gate" and the other of which being termed the "back gate"). Further, the first metal gate 115 and the second metal gate 116 may optionally include different workfunction materials layers. Still further, the first and second metal gates may have different conductive gate metals such as W and Al, respectively, to provide asymmetric functional characteristics.

Figure 10:
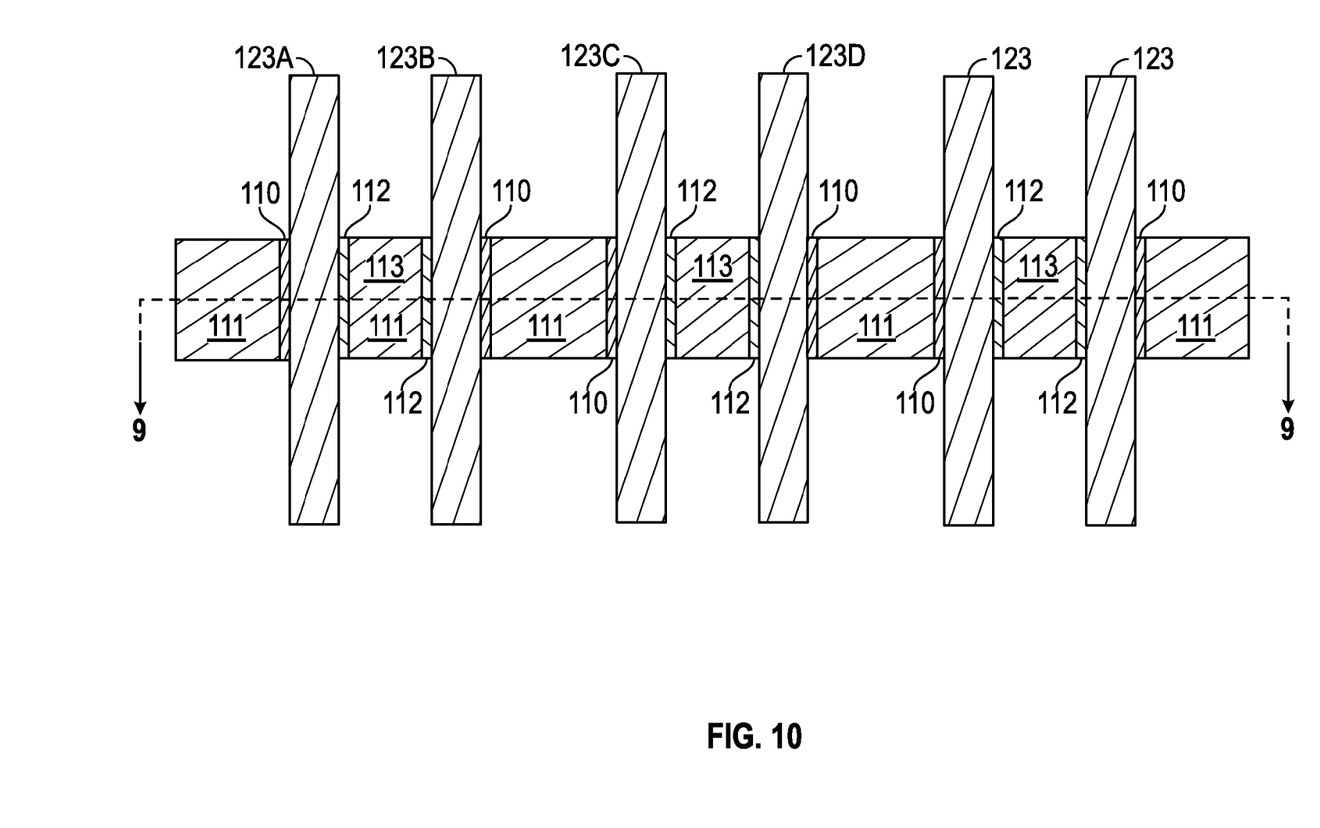

FIGS. 9 and 10 show (in cross-section and from above, respectively) the FinFET structure at the stage of fabrication after all of the gate structures have been completed. As shown, the FinFET structure includes a semiconductor substrate and at least a first, second, and third fin 123 disposed over the semiconductor substrate 101, 102 (a total of six fin structures are shown). The first fin structure 123A is spaced apart from the second, adjacent fin structure 123B by the first gap region or space 106 having the first width across the semiconductor substrate (i.e., D106), and the second fin structure is space apart from the third, adjacent fin structure 123C by the second gap region 108 having the second width (i.e., D108) across the semiconductor substrate that is greater than the first width D106. The semiconductor structure further includes a first metal gate 115 including a first workfunction metal (not shown) and conductive metal material 113 disposed within the first gap 106 region and a second metal gate including a second workfunction metal (not shown) and conductive metal material 111 disposed within the second gap region 108. The FinFET structures further include a first gate dielectric layer 112 disposed within the first gap region 106 between the first and second fin structures 103 and the first metal gate material 113 and a second gate dielectric layer 110 disposed within the second gap region 108 between the second and third fin structures 103 and the second metal gate material 111. Further, a fourth fin structure 123D may be provided similar to the second fin structure 123B, and so forth for as many fin structures 123 as may be desired.

Fabrication of the FinFET semiconductor device may thereafter continue with further processing steps that can be performed to complete the fabrication the device, as are well-known in the art. Further steps conventionally include, for example, the formation of an insulating layer overlying the fins and the metal gates, the formation of contacts (formed by depositing a photoresist material layer over the insulating layer, lithographic patterning, etching to form contact voids, and depositing a conductive material in the voids to form the contacts), and the formation of one or more patterned conductive layers across the device above the insulating layer, among many others. The subject matter disclosed herein is not intended to exclude any subsequent processing steps to form and test the completed FinFET semiconductor device as are known in the art. Furthermore, with respect to any of the process steps described above, one or more heat treating and/or annealing procedures can be employed after the deposition of a layer, as is commonly known in the art.

Accordingly, the various embodiments herein provide methods for fabricating semiconductor structures, and in particular FinFET transistors, with asymmetric front and back gates. The described embodiments are compatible with existing process flows, and require only one masking step for each of the front and back gates, thus requiring fewer masking and patterning procedures that processes know in the prior art for an overall lower design and fabrication cost.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A semiconductor structure comprising:
   a support substrate;
   an electrical insulator layer overlying the support substrate and in direct physical contract with the support substrate;
   a first, second, and third fin structure disposed over and in direct physical contact with the electrical insulator layer, wherein the electrical insulator layer is continuous and uninterrupted underneath and between each of the first, second, and third fin structures, wherein the first fin structure is spaced apart from the second, adjacent fin structure by a first gap region having a first width across the semiconductor substrate, and wherein the second fin structure is space apart from the third, adjacent fin structure by a second gap region having a second width across the semiconductor substrate that is greater than the first width;
   a first metal gate structure comprising a first gate dielectric layer and a first metal gate material, the first metal gate structure being disposed within the first gap region so as to be in direct physical contact with a first sidewall of the first fin structure and a first sidewall of the second fin structure, wherein the first sidewalls of the first and second fin structures face each other across the first gap region, wherein the first metal gate structure is not disposed within the second gap region; and
   a second metal gate structure comprising a second gate dielectric layer and a second metal gate material, the second metal gate structure being disposed within the second gap region so as to be in direct physical contact with a second sidewall, opposite the first sidewall, of the second fin structure and a first sidewall of the third fun structure, wherein the second sidewall of the second fin structure and the first sidewall of the third fin structure face each other across the second gap region, wherein the second metal gate structure is not disposed within the first gap region.

2. The semiconductor structure of claim 1, further comprising:
   a fourth fin structure spaced apart from the third fin structure by a third gap region having a width approximately equal to the first width across the semiconductor substrate; and
   a third metal gate comprising the first metal gate material disposed within the third gap region, wherein the third metal gate is in direct physical contact with a second sidewall, opposite the first sidewall, of the third fin structure and a first sidewall of the fourth fin structure, wherein the second sidewall of the third fin structure and the first sidewall of the fourth fin structure face each other across the third gap region, wherein the first and second metal gate structures are not disposed within the third gap region.

3. The semiconductor structure of claim 1, wherein the semiconductor structure comprises a silicon-on-insulator semiconductor substrate.

4. The semiconductor structure of claim 1, wherein one or both of the first and second metal gates further comprise a workfunction material.

5. The semiconductor structure of claim 1, further comprising a first gate insulator material disposed within the first gap region and a second gate insulator material disposed within the second gap region, wherein the first and second gate insulator materials are each independently selected from the group consisting of: SiON, hafnium oxide, and zirconium oxide.

6. The semiconductor structure of claim 5, wherein the first gate insulator material forms a continuous layer disposed along sidewalls of and underneath the first metal gate, and wherein the second gate insulator material forms a continuous layer disposed along sidewalls of and underneath the second metal gate.

* * * * *